United States Patent [19]

Kawakami

[11] Patent Number: 5,642,062

[45] Date of Patent: Jun. 24, 1997

[54] COMPARATOR CIRCUIT OPERATING ON VARIABLE CURRENT

[75] Inventor: Naomi Kawakami, Kanagawa, Japan

[73] Assignee: NEC Corporation, Tokyo, Japan

[21] Appl. No.: 521,851

[22] Filed: Aug. 31, 1995

[30] Foreign Application Priority Data

Aug. 31, 1994 [JP] Japan .................................. 6-206450

[51] Int. Cl.$^6$ .................................. H03K 5/24; H03F 3/45
[52] U.S. Cl. .................. 327/66; 327/108; 327/490; 327/544; 327/563; 330/261
[58] Field of Search ...................... 327/544, 560, 327/561, 562, 563, 65, 66, 489, 108, 53, 54, 67, 52, 490; 330/253, 261, 257, 51

[56] References Cited

U.S. PATENT DOCUMENTS

| 4,874,969 | 10/1989 | Meadows | 327/206 |
| 4,987,379 | 1/1991 | Hughes | 330/257 |
| 5,126,683 | 6/1992 | Ishikawa et al. | 327/50 |
| 5,182,525 | 1/1993 | Theus | 330/257 |
| 5,283,535 | 2/1994 | Sevenhans et al. | 330/253 |
| 5,367,211 | 11/1994 | Giordano et al. | 327/205 |

FOREIGN PATENT DOCUMENTS

| 0 207 159 | 1/1987 | European Pat. Off. . |
| 0 452 967 | 10/1991 | European Pat. Off. . |
| 2-37824 | 2/1990 | Japan . |
| 4-157372 | 5/1992 | Japan . |

Primary Examiner—Timothy P. Callahan
Assistant Examiner—Terry L. Englund
Attorney, Agent, or Firm—Young & Thompson

[57] ABSTRACT

A comparator circuit includes a differential amplifier circuit (5, 6, and 7) which receives a first input voltage and a second input voltage, and outputs a comparison result signal by comparing the first and second input voltages, a current circuit (8) which supplies a driving current to activate the differential amplifier circuit, and a current control circuit (2) which is connected to the differential amplifier circuit and the current circuit. The current control circuit is deactivated when the first input voltage is lower than the second input voltage, and is activated when the first input voltage is higher than the second input voltage to reduce the driving current supplied.

7 Claims, 3 Drawing Sheets

COMPARATOR CIRCUIT OPERATING ON VARIABLE CURRENT

BACKGROUND OF THE INVENTION

1. Field of the Invention

The present invention relates to a comparator circuit and, more particularly, to a comparator circuit which compares first and second input voltages supplied thereto.

2. Description of the Related Art

A typical comparator circuit is shown in FIG. 4 and includes a differential circuit 5 which compares the input signal voltages $V_{IN1}$ and $V_{IN2}$ applied to input terminals IN1 and IN2, a current amplifier 6 which amplifies the output of the differential amplifier 5, a driving circuit 7 which outputs an output voltage OUT, and a constant current circuit 8 which supplies operating currents to the differential amplifier 5 and the current amplifier 6. The constant current circuit 8 is equipped with transistors Q5, Q6 and Q7 and a current source $I_S$. The transistors Q5–Q7 constitute a current mirror circuit.

In the differential circuit 5, when the first input voltage $V_{IN1}$ is lower than the second input voltage $V_{IN2}$, transistors Q1 and Q2 are rendered conductive and non-conductive, respectively. Transistors Q3 and Q4, which constitute a current mirror, are thereby operated to pull down the base voltage of a transistor Q8 which is thereby turned OFF. therefore, a transistor Q9 receives a base current from the transistor Q6 to pull down the voltage of an output terminal OUT.

In the case where the first input voltage $V_{IN1}$ is higher than the second voltage $V_{IN2}$, on the other hand, the transistors Q1, Q3 and Q4 are turned OFF, whereas the transistor Q2 is turned ON. Accordingly, the transistor Q8 is rendered conductive to turn the transistor Q9 OFF.

In the manner as described above, the signal comparison operation is performed on the input signals $V_{IN1}$ and $V_{IN2}$. However, this comparator circuit always consumes an operating current determined by the currents $I_1$ to $I_3$ irrespective of the levels of the input voltages $V_{IN}$.

SUMMARY OF THE INVENTION

It is an object of this invention to provide a comparator circuit which performs a voltage comparison operation with reduced current consumption.

A comparator according to the present invention comprises a comparison circuit operating on a power current supplied thereto and compares a first voltage with a second voltage, and a variable current source coupled to the comparison circuit which produces and supplies the power current to the comparison circuit such that the power current has a first current value when the first voltage is lower than the second voltage and a second current value that is smaller than the first current value when the first voltage is higher than the second voltage.

Thus, in the comparator according to the present invention, the power current supplied to the comparison circuit is varied in accordance with the relationship in magnitude between the first and second voltages.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
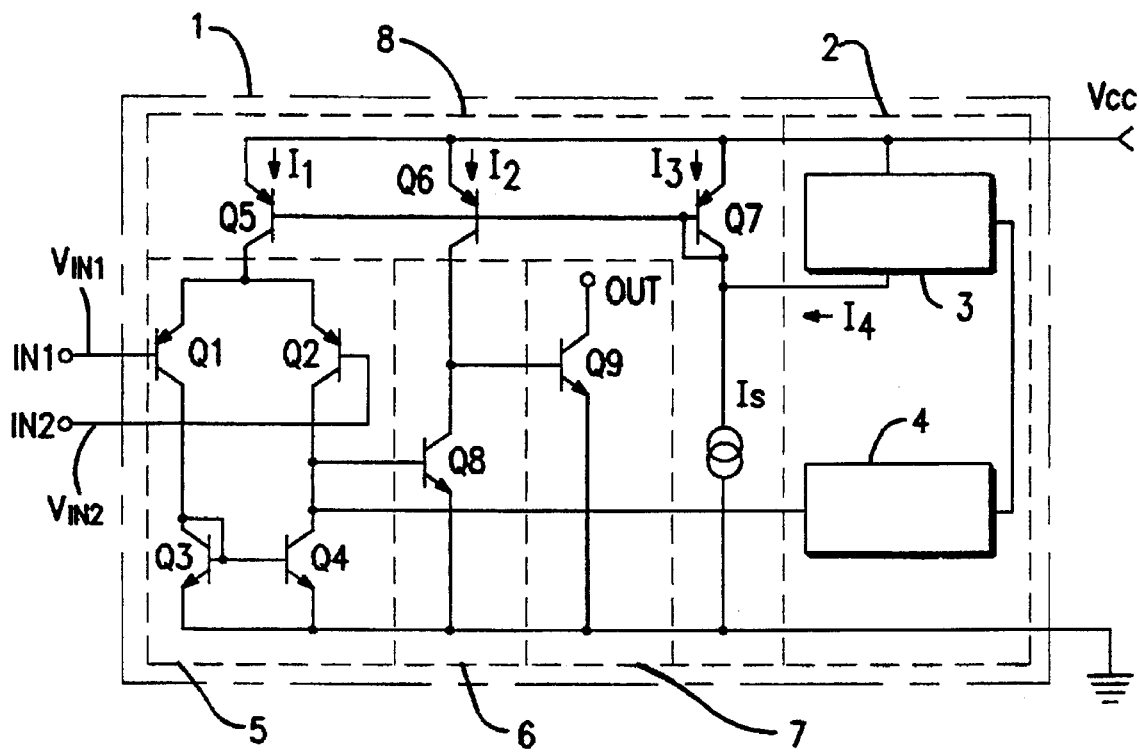
FIG. 1 is a circuit diagram illustrative of a comparator circuit according to a first embodiment of the present invention.
Figure 4:
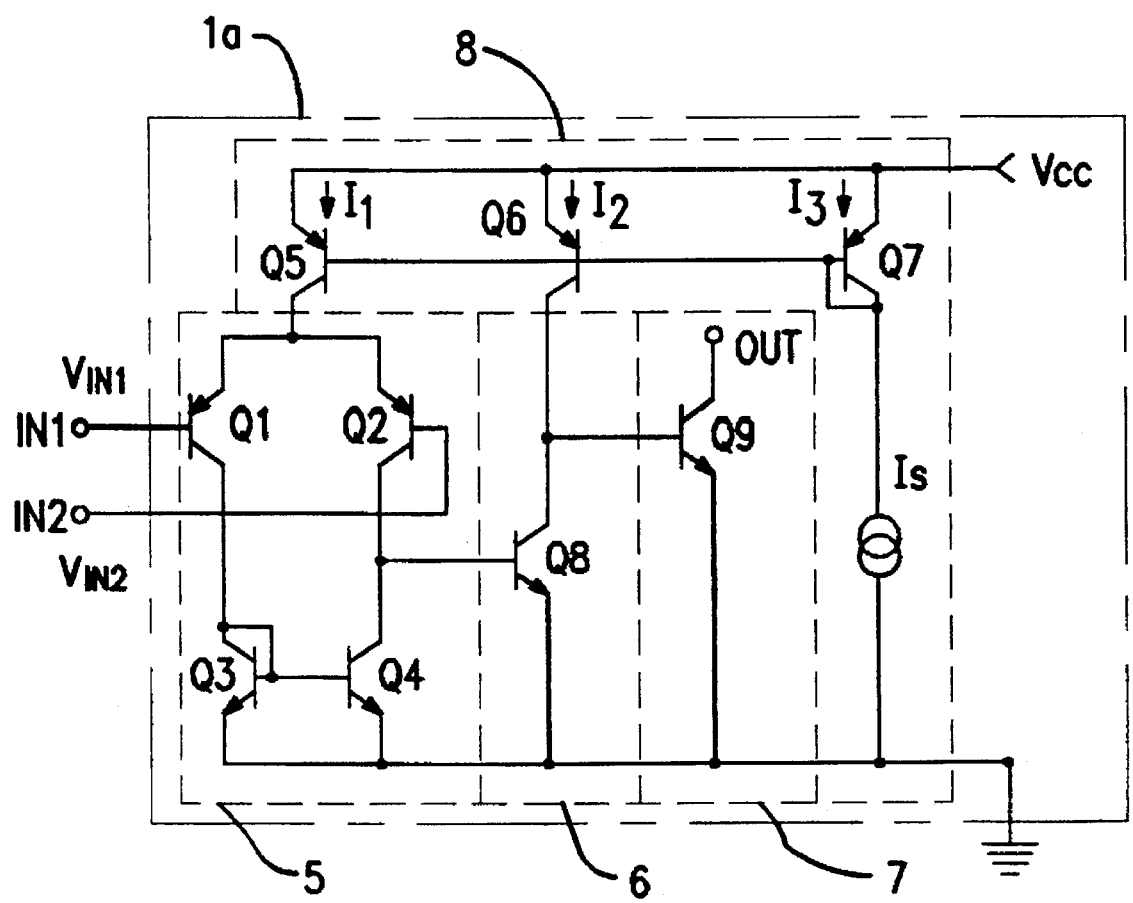
FIG. 4 is a circuit diagram illustrative of a prior art comparator circuit.

Referring now to FIG. 1, a comparator circuit according to a first embodiment of this invention includes, in addition to a differential circuit 5, a current amplifier 6, a driving circuit 7 and a constant current circuit 8, a current control circuit 2 consisting of a switching circuit 3 and a switching control circuit 4. The circuit parts 5, 6, 7 and 8 are the same as those shown in FIG. 4.

The input end of the switching control circuit 4 is connected to the collector of the transistor Q4, and the output end of the switching control circuit 4 is connected to the switching circuit 3 which is in turn connected in parallel to the transistor Q7. The rest of the configuration is the same as the conventional circuit shown in FIG. 4 so that the further description thereof will be omitted.

Figure 2:
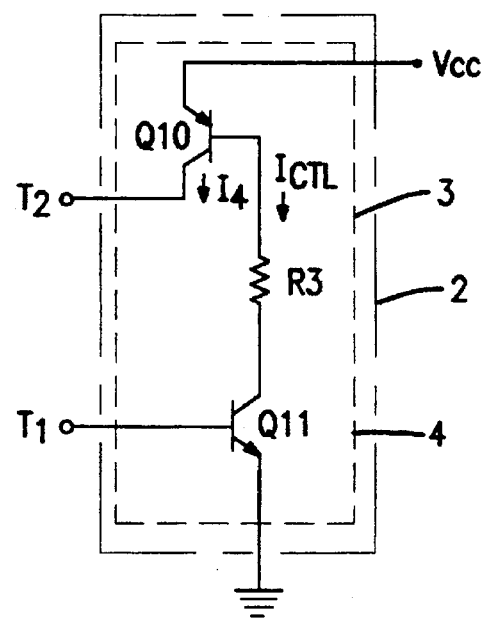
FIG. 2 is a circuit diagram illustrative of the current control circuit 2 as shown in FIG. 1.

Referring to FIG. 2, the switching control circuit 4 is constituted of a transistor Q11 and a resistor R3, and the switching circuit 3 is constituted of a transistor Q10. The emitter of the transistor Q11 is grounded, and its base is connected to the collector of the transistor Q4. One end of the resistor R3 is connected to the collector of the transistor Q11, and the other end of R3 is connected to the base of the transistor Q10. The emitter of the transistor Q10 is connected to a power supply $V_{CC}$ (i.e., the emitter of the transistor Q7), and its collector is connected to the collector of the transistor Q7.

In operation, when the first input signal voltages $V_{IN1}$ is larger than the second voltage $V_{IN2}$, the transistor Q2 is turned ON and the transistor Q1 is turned OFF. The transistors Q3 and Q4 are thereby rendered non-conductive. The transistor Q2 increases the voltage at its collector, so that the transistor Q8 is turned ON and the transistor Q9 is turned OFF.

The increased-collector voltage of the transistor Q2 further turns the transistor Q11 ON. A base current $I_{CTL}$ thus flows into the transistor Q10 to thereby produce its collector current 14 which is in turn supplied to the constant current source $I_S$. The current $I_3$ flowing through the transistor Q7 is reduced accordingly. Since the transistors Q5–Q7 constitutes a current mirror circuit, each of the transistors Q5 and Q6 produces its collector current proportional to the current flowing through the transistor Q7. Thus, the currents $I_1$ and $I_2$, which are produced by the transistors Q5 and Q6 and supplied to the circuit parts 5 and 6, are also reduced.

The current $I_4$ flowing through the transistor Q10 is determined by its base current $I_{CTL}$ which is in turn controlled by the resistor R3. Accordingly, the changes of the currents $I_1$–$I_3$ are controllable by the resistor R3. Since the base current $I_{CTL}$ is representative of $I_4/h_{FE}$ ($h_{FE}$ being a current gain of the transistor Q10), it is considerably small. Accordingly, the current consumption of the present comparator becomes small as compared to the prior art comparator.

When the first input voltage $V_{IN1}$ becomes lower than the second input voltage $V_{IN2}$, the transistors Q1, Q3 and Q4 are turned ON and the transistor Q2 is turned OFF. The voltage at the base of the transistor Q8 is thereby pulled down, so that the transistors Q8 and Q11 are made non-conductive. The transistor Q9 receives the current from the transistor Q6 to drive the output terminal OUT to the low level. At this time, the transistor Q10 is in the cut-off state by the non-conductive state of the transistor Q11, and hence the current 12 flowing through the transistor Q6 is increased. Accordingly, the transistor Q9 receives the current enough to drive the output terminal OUT at a high speed.

As in the above, in the comparator circuit according to this embodiment, the current consumption is $(I_1+I_2+I_3)$, the same as in the conventional circuit, when the output voltage OUT is at the low level. However, when the output voltage OUT is at the high level, the current consumption can arbitrarily be set to one part in several, one part in several tens, or the like, of the conventional value by selecting the current supply ratio of the transistors Q7 and Q10 to the current source $I_S$. In other words, it is possible to reduce the current consumption compared with the conventional case.

It is to be noted that the currents $I_1-I_3$ are reduced when the input voltage $I_{IN1}$ is larger than the voltage $V_{IN2}$. Specifically, when the output voltage is at the high level, the transistor Q9 is nonconductive, and no current flows in the transistor Q9 in that case. Therefore, no problem will arise unless the conduction states of the transistor Q9 and the transistor Q8 are changed by changing the base potentials of the respective transistors. Accordingly, at that time, a current which can maintain the conduction state of the transistor Q8 suffices, so that the currents $I_1$ and $I_2$ can be reduced. However, when the output voltage is at the low level, the transistor Q9 is in the conductive state, and a part of the current $I_2$ flows into the transistor Q9 as the base current. The collector current of the transistor Q9 is the larger for the larger value of the base current, and it is possible to lower the potential of the output OUT more rapidly for the larger collector current. That is to say, the speed of the shift of the potential of the output OUT from the high level to the low level can be made faster for the larger base current. Accordingly, when the output voltage OUT is at the low level, in order to prevent the drop in the operating speed of the comparator circuit, it is necessary to retain a current which is at least equal to the conventional current 12 in the transistor Q8, and it is not recommended to reduce the current 12.

Figure 3:
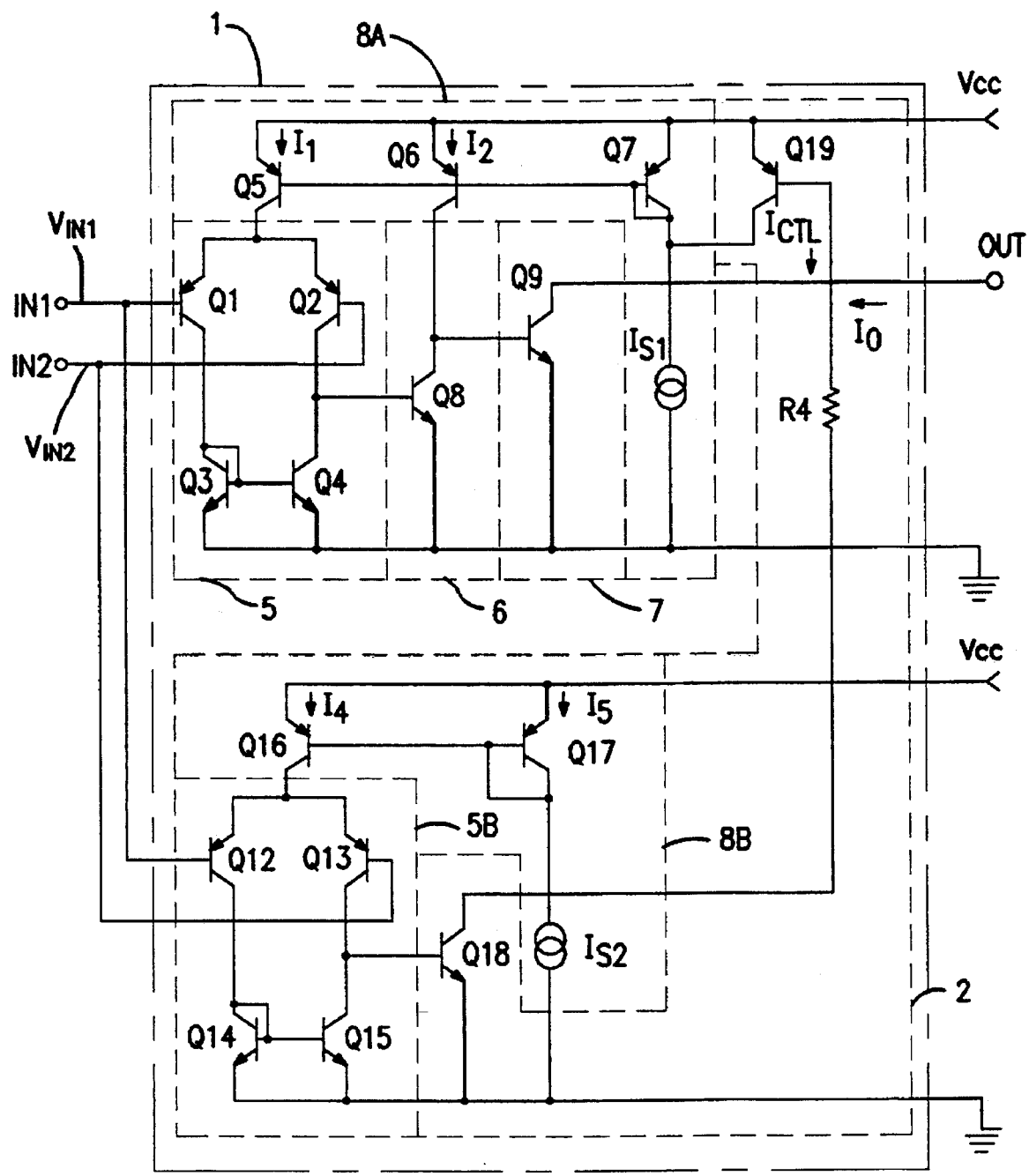
FIG. 3 is a circuit illustrative of comparator circuit according to a second embodiment of the present invention.

FIG. 3 is a circuit diagram illustrative of a second embodiment of the comparator circuit according to this invention. As shown in FIG. 3, the comparator circuit 1 of this embodiment is set up to control the current circuit by detecting a change in the potential of the two inputs of the differential amplifier, in contrast to controlling the current circuit 8 by detecting the output of the differential amplifier in the first embodiment. For that purpose, this embodiment includes two differential amplifiers 5A and 5B which are connected in parallel to input terminals IN1 and IN2, and separately compare two input signals and output the difference by amplifying the difference, a current amplifier 6 which amplifies the output of one of the differential amplifier, 5A, a driving circuit 7 which is driven by the output of the current amplifier 6, a first current circuit 8A which supplies constant currents $I_1$ and $I_2$ to the differential amplifier 5A and the current amplifier 6, respectively, a second current circuit 8B which supplies a constant current to the other differential amplifier 5B, and a current control circuit 2 which controls the first current circuit 8A by detecting the output of the differential amplifier 5B.

Among these circuits, the differential amplifier 5A, the current amplifier 6, the driving circuit 7, and the first current circuit 8A have the configuration similar to those circuits described in the first embodiment. The newly added differential amplifier 5B consists of transistors Q12 to Q15, the current circuit 8B consists of the transistors Q16 and Q17, and a current source IS2, and the current control circuit 2 consists of a transistor Q18 which receives the output of the differential amplifier 5B to its base, a resistor R4 and a switching transistor Q19.

Although the differential amplifier 5B and the current circuit 8B are formed separately from the current control circuit 2, the differential amplifier 5B and the current circuit 8B may be formed integrally in the current control circuit 2.

The operation of the comparator circuit 1 described above is basically the same as that of the first embodiment so that its description will be omitted, but it should be mentioned that an effect similar to that of the first embodiment can also be obtained by this embodiment.

It is apparent that the present invention is not limited to the above embodiments but may be modified and changed without departing from the scope and spirit of the invention.

What is claimed is:

1. A comparator circuit comprising: a differential amplifier circuit which receives a first input voltage and a second input voltage and outputs a comparison result signal by comparing said first and second input voltages, a current circuit which supplies a driving current to said differential amplifier circuit, and a current control circuit connected to said differential amplifier circuit and to said current circuit, said current control circuit being deactivated when said first input voltage is lower than said second input voltage and being activated when said first input voltage is higher than said second input voltage to control said current circuit such that said driving current is reduced while remaining above a zero value.

said differential amplifier circuit including a first transistor of a first conductivity type having said first input voltage applied to its base, a second transistor of said first conductivity type having said second input voltage applied to its base and its emitter connected to the emitter of said first transistor, and a current mirror circuit having the collector of said first transistor as the input and the collector of said second transistor as the output, said current circuit including a third transistor of said first conductivity type having its collector and base connected in common and its emitter connected to a first power supply, a fourth transistor of said first conductivity type having its base connected to the base of said third transistor, its collector connected to the emitter of said first transistor, and its emitter connected to said first power supply, and a current source having one end connected to a second power supply and another end connected to the collector of said third transistor, and said current control circuit including a fifth transistor of a second conductivity type having its emitter connected to said second power supply and its base connected to the collector of said second transistor, and a sixth transistor of said first conductivity type having its base connected to the collector of said fifth transistor, its emitter connected to said first power supply, and its collector connected to the collector of said third transistor.

2. The comparator circuit as claimed in claim 1, wherein said differential amplifier circuit further includes a seventh transistor of said second conductivity type with its base connected to the collector of said second transistor and its emitter connected to said second power supply, and an eighth transistor of said second conductivity type with its base connected to the collector of said seventh transistor, its emitter connected to said second power supply, and its collector outputting said comparison result signal, and said current circuit further includes a ninth transistor of said first conductivity type with its emitter connected to said first power supply, its base connected to the collector of said third transistor, and its collector connected to the collector of said seventh transistor.

3. A comparator circuit comprising, a differential amplifier circuit which receives a first input voltage and a second input voltage and outputs a first or a second level signal depending upon the result of comparison of said first and second input voltages, a current circuit which supplies a specified driving current to said differential amplifier circuit, and a current control circuit connected to the output of said differential amplifier circuit and to said current circuit, said current control circuit being inactivated when said differential amplifier circuit outputs the first level signal, and being activated when said differential amplifier circuit outputs the second level signal to reduce said specified driving current supplied to said differential amplifier circuit by said current circuit while keeping said reduced specified driving current above a zero value, said differential amplifier circuit including a first transistor of a first conductivity type having said first input voltage applied to its base, a second transistor of said first conductivity type having said second input voltage applied to its base and its emitter connected to the emitter of said first transistor, and a current mirror circuit having one of the collectors of said first and second transistors as its input and the other collector as its output, said current circuit supplying said driving current to the emitter of said first transistor, said first and second level signals being output from the collector of said second transistor, said current mirror circuit having the collector of said first transistor as its input and the collector of said second transistor as its output, said current circuit including a third transistor of said first conductivity type having its collector and base connected in common and its emitter connected to a first power supply, a fourth transistor having its base connected to the base of said third transistor, its collector connected to the emitter of said first transistor, and its emitter connected to said first power supply, and a current source having one end connected to a second power supply and another end connected to the collector of said third transistor, and said current control circuit including a fifth transistor of a second conductivity type having its emitter connected to said second power supply and its base connected to the collector of said second transistor, and a sixth transistor of said first conductivity type having its base connected to the collector of said fifth transistor, its emitter connected to said first power supply, and its collector connected to the collector of said third transistor.

4. A comparator circuit comprising:

a current circuit producing a first current at a first node and a second current at a second node, said first current taking, in a first state, a first value and, in a second state, a second value that is smaller than said first value, said second current taking, in said first state, a third value and, in said second state, a fourth value that is smaller than said third value, a comparison circuit coupled to said first node to operate on said first current and having an output node, a first input node supplied with a first input voltage and a second input node supplied with a second input voltage to compare said first input voltage with said second input voltage, a drive transistor coupled to said second node to operate on said second current and having a control electrode coupled to said output node of said comparison circuit, said comparison circuit producing at said output node an intermediate output voltage which takes a first level that increases a current ability of said drive transistor when said first input voltage is higher than said second input voltage, and a second level that decreases the current ability of said drive transistor when said first input voltage is lower than said second input voltage, an output transistor having a control electrode coupled to said second node and driven by a voltage at said second node, and control means for bringing each of said first and second currents into said second state when said first input voltage is higher than said second input voltage and into a first state when said first input voltage is lower than said second input voltage.

5. The comparator circuit as claimed in claim 4, wherein said current circuit includes a current mirror circuit having a current input node coupled to a current source, a first current output node coupled to said first node and a second current output node coupled to said second node, said current mirror circuit producing said first and second currents at said first and second current output nodes, respectively, in response to an input current supplied to said current input node, and said control means decreases said input current when said first input voltage is higher than said second input voltage and increases said input current when said first input voltage is lower than said second input voltage.

6. The comparator circuit as claimed in claim 5, wherein said control means comprises a first transistor having a control electrode coupled to said output node of said comparison circuit and a second transistor coupled to said first transistor to change said input current in response to a current flowing through said first transistor.

7. The comparator circuit as claimed in claim 5, wherein said control means comprises an additional current circuit producing a third current, an additional comparison circuit operating on said third current and having an output end, a first input end supplied with said first input voltage and a second input end supplied with said second input voltage, a first transistor having a control electrode coupled to said output end of said additional comparison circuit, and a second transistor coupled to said first transistor to change said input current.

* * * * *